(12) United States Patent
Adachi

(10) Patent No.: US 7,638,932 B2
(45) Date of Patent: Dec. 29, 2009

(54) PIEZOELECTRIC ELEMENT AND ULTRASONIC ACTUATOR

(75) Inventor: Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 296 days.

(21) Appl. No.: 11/886,580

(22) PCT Filed: Jan. 29, 2007

(86) PCT No.: PCT/JP2007/051385

§ 371 (c)(1),
(2), (4) Date: Sep. 18, 2007

(87) PCT Pub. No.: WO2007/091443

PCT Pub. Date: Aug. 16, 2007

(65) Prior Publication Data

US 2009/0021114 A1    Jan. 22, 2009

(30) Foreign Application Priority Data

Feb. 7, 2006    (JP) .............................. 2006-029368

(51) Int. Cl.
*H01L 41/047*    (2006.01)
*H01L 41/08*     (2006.01)

(52) U.S. Cl. .................. 310/365; 310/366; 310/323.04; 310/323.06

(58) Field of Classification Search ......... 310/363–366, 310/323.04, 323.06, 323.09
See application file for complete search history.

(56) References Cited

U.S. PATENT DOCUMENTS

| 7,005,776 B1 * | 2/2006 | Iino et al. ............... 310/316.01 |
| 7,061,159 B2 * | 6/2006 | Funakubo .............. 310/323.12 |
| 7,362,036 B2 * | 4/2008 | Sasaki ................... 310/323.16 |
| 7,514,843 B2 * | 4/2009 | Nagahama et al. .......... 310/317 |
| 7,545,085 B2 * | 6/2009 | Adachi ....................... 310/365 |

(Continued)

FOREIGN PATENT DOCUMENTS

JP    07209070 A  *  8/1995

(Continued)

*Primary Examiner*—J. SanMartin
(74) *Attorney, Agent, or Firm*—McDermott Will & Emery LLP

(57) ABSTRACT

Internal electrode layers (5) include a common electrode layer (3) and feed electrode layers (6) alternately placed in a stacking direction with piezoelectric layers (1) interposed between the common electrode layer (3) and the feed electrode layers (6). The common electrode layer (3) has a common electrode (3a). The feed electrode layers (6) include a first feed electrode layer (6a) and a second feed electrode layer (6b). The first feed electrode layer (6) has four divided electrodes (2a through 2d) and a first connection electrode (2e) for providing connection between two of the divided electrodes (2b, 2d). The second feed electrode layer (6) has four divided electrodes (4a through 4d) and a second connection electrode (4e) for providing connection between two of the divided electrodes (4a, 4c). The first and second connection electrodes (2e, 4e) are formed on parts of longitudinally middle parts of the associated piezoelectric layers (1) except both transverse end parts of the associated piezoelectric layers (1), respectively. The common electrode (3a) is connected to an external electrode (7g). The two divided electrodes (2b, 2d) of the first feed electrode layer (6a) are connected through external electrodes (7b, 7d) to the two divided electrodes (4b, 4d) of the second electrode layer (6b). The other divided electrodes (2a, 2c) of the first feed electrode layer (6a) are connected through external electrodes (7a, 7c) to the other divided electrodes (4a, 4c) of the second electrode layer (6b).

14 Claims, 11 Drawing Sheets

U.S. PATENT DOCUMENTS

2004/0189155 A1* 9/2004 Funakubo .................. 310/366
2008/0278032 A1* 11/2008 Adachi et al. ............... 310/317
2008/0278033 A1* 11/2008 Adachi et al. ............... 310/317

FOREIGN PATENT DOCUMENTS

| JP | 2000-308376 | | 11/2000 |
| JP | 2003-501988 A | | 1/2003 |
| JP | 2004-320980 | | 11/2004 |
| JP | 2006-187112 | | 7/2006 |
| JP | 2006187112 A | * | 7/2006 |
| JP | 2007074896 A | * | 3/2007 |
| JP | 2007312600 A | * | 11/2007 |
| WO | WO 00/74153 A1 | | 12/2000 |

* cited by examiner

PIEZOELECTRIC ELEMENT AND ULTRASONIC ACTUATOR

RELATED APPLICATIONS

This application is the U.S. National Phase under 35 U.S.C. § 371 of International Application No. PCT/JP2007/051385 filed on Jan. 29, 2007, which in turn claims the benefit of Japanese Application No. 2006-029368, filed on Feb. 7, 2006, the disclosures of which Applications are incorporated by reference herein.

TECHNICAL FIELD

The present invention relates to piezoelectric elements and ultrasonic actuators including the same.

BACKGROUND ART

An ultrasonic actuator has been conventionally known which is for use in various electronic devices or other devices and includes a piezoelectric element (electromechanical transducer) (see, for example, Patent Document 1). This piezoelectric element is obtained by alternately stacking piezoelectric bodies and electrodes. For the ultrasonic actuator, the piezoelectric element is vibrated by applying voltages to the electrodes, thereby moving a movable object.

Patent Document 1: Japanese Unexamined Patent Application Publication (Translation of PCT Application) No. 2003-501988

DISCLOSURE OF THE INVENTION

Problems that the Invention is to Solve

The present inventor invented the following ultrasonic actuator. FIG. 13 is a perspective view of the ultrasonic actuator. FIG. 14(*a*) is a perspective view of a piezoelectric element for use in the ultrasonic actuator. FIG. 14(*b*) is an exploded perspective view of the piezoelectric element.

As illustrated in FIGS. 13 and 14, a piezoelectric element 100 is contained in a case 103 and supported by three supporting members 104A through 104C disposed on the case 103. Drivers 110, 110 are disposed on one of end surfaces of the piezoelectric element 100 to support a movable object 111 and pressed against the movable object 111 by the supporting member 104B.

The piezoelectric element 100 is obtained by alternately stacking piezoelectric bodies 101 and internal electrodes 102. The internal electrode 102G is a common electrode (ground electrode) substantially entirely formed on a principal surface of an associated one of the piezoelectric bodies 101. The piezoelectric bodies 101 are polarized in the directions shown by the arrows in FIG. 14.

The internal electrodes 102A through 102D and 102G are connected to external electrodes 103A through 103D and 103G, respectively. The external electrodes 103A through 103D and 103G are disposed on the end surfaces of the piezoelectric element 100. For example, wires 108A through 108D and 108G are connected through solders 107 to the external electrodes 103A through 103D and 103G, respectively. Voltages are supplied through these wires 108A through 108D and 108G to the internal electrodes 102A through 102D and 102G, respectively.

Meanwhile, the resonance frequencies of later-described stretching and bending vibrations of the piezoelectric element 100 are determined by the material and shape of the piezoelectric element 100 and other factors. The material and shape of the piezoelectric element 100 and other factors are determined such that the resonance frequency of the stretching vibration generally coincides with that of the bending vibration.

The motions of the ultrasonic actuator will be described hereinafter. FIGS. 6 through 8 are conceptual diagrams for explaining the geometries of the vibrating piezoelectric element.

The wire 108G is connected to the ground. A sinusoidal reference voltage of a specific frequency is applied through the wires 108A and 108C to the internal electrodes 102A and 102C arranged along one of the diagonal lines across a principal surface of an associated one of the piezoelectric bodies 101. A sinusoidal voltage having substantially the same magnitude and frequency as the reference voltage is applied through the wires 108B and 108D to the internal electrodes 102B and 102D arranged along the other diagonal line. In view of the above, in-phase voltages are applied to the internal electrodes 102A and 102C, and in-phase voltages are applied to the internal electrodes 102B and 102D. When the difference in phase between the reference voltage and the voltage applied to each of the internal electrodes 102B and 102D is 0°, a primary mode of a stretching vibration is induced in the piezoelectric element 100 as illustrated in FIG. 6. On the other hand, when the above-mentioned difference in phase is 180°, a secondary mode of a bending vibration is induced in the piezoelectric element 100 as illustrated in FIG. 7.

When a sinusoidal reference voltage of a frequency close to the two generally coinciding resonance frequencies is applied to the internal electrodes 102A and 102C, and the sinusoidal voltage that is 90° or −90° out of phase with the reference voltage and has substantially the same magnitude and frequency as the reference voltage is applied to the internal electrodes 102B and 102D, the primary mode of the stretching vibration and the secondary mode of the bending vibration are harmonically induced in the piezoelectric element 100. This induction causes variations in the shape of the piezoelectric element 100 as illustrated in FIGS. 8(*a*), 8(*b*), 8(*c*), and 8(*d*) in this order. As a result, the drivers 110, 110 placed on the piezoelectric element 100 each produce a generally elliptical motion when viewed from the front of the paper of the drawing in FIG. 8. More particularly, the synthesis of the bending and stretching vibrations of the piezoelectric element 100 allows the drivers 110, 110 to each produce an elliptical motion. This elliptical motion allows the movable object 111 supported by the drivers 110, 110 to move relative to the piezoelectric element 100 in the direction shown by the arrow A or B.

Meanwhile, for the ultrasonic actuator, at least five wires 108A through 108D and 108G need to be connected to external electrodes 103A through 103D and 103G on the piezoelectric element 100. Therefore, the wires 108A through 108D and 108G and the solders 107 serving as conductive connecting members for providing connection between the wires 108A through 108D and 108G and the external electrodes 103A through 103D and 103G place burdens on vibration of the piezoelectric element 100, leading to the inhibited vibration thereof. As a result, the efficiency of the ultrasonic actuator may be reduced.

Furthermore, a stress concentration part of the piezoelectric element on which stresses arising from vibrations are concentrated is only partially formed with the internal electrodes 102A through 102D and 102G. Therefore, when the piezoelectric element 100 is reduced in size, this cannot provide strong stretching vibrations. As a result, the efficiency of the ultrasonic actuator may be further reduced.

Moreover, part of the piezoelectric element other than the stress concentration part is formed with the internal electrodes 102A through 102D and 102G. Therefore, power is consumed even in parts of the piezoelectric element in which stresses arising from vibrations are hardly generated. As a result, the efficiency of the ultrasonic actuator may be still further reduced.

The present invention is made in view of the above, and its object is to, while restraining vibration of a piezoelectric element from being inhibited, provide a strong stretching vibration even with a miniaturization in the size of the piezoelectric element and reduce power consumption in parts of the piezoelectric element in which stresses arising from vibrations are hardly generated.

Means of Solving the Problems

In order to achieve the above object, the present invention provides a piezoelectric element obtained by alternately stacking generally rectangular piezoelectric layers and internal electrode layers, wherein the internal electrode layers include a common electrode layer and feed electrode layers alternately placed in a stacking direction with the piezoelectric layers interposed between the common electrode layer and the feed electrode layers, the common electrode layer has a common electrode, the feed electrode layers include a first feed electrode layer disposed on a principal surface of one of the piezoelectric layers and a second feed electrode layer disposed on a principal surface of one of the piezoelectric layers different from the piezoelectric layer on the principal surface of which the first feed electrode layer is disposed, the first feed electrode layer has four divided electrodes respectively disposed on four areas defined by dividing the principal surface of the associated piezoelectric layer into two parts in the longitudinal and transverse directions, and a first connection electrode for providing connection between two of the four divided electrodes respectively disposed on two of the areas opposed along a first-diagonal-line direction of the principal surface of the associated piezoelectric layer, the second feed electrode layer has four divided electrodes respectively disposed on the four areas, and a second connection electrode for providing connection between two of the four divided electrodes respectively disposed on two of the areas opposed along a second-diagonal-line direction of the principal surface of the associated piezoelectric layer, the first and second connection electrodes are formed on parts of longitudinally middle parts of the associated piezoelectric layers except both transverse end parts of the associated piezoelectric layers, respectively, the common electrode is connected to an external electrode disposed on an outer surface of the piezoelectric element, the two divided electrodes of the first feed electrode layer respectively disposed on two of the areas opposed along the first-diagonal-line direction are connected through an external electrode disposed on the outer surface of the piezoelectric element to the two divided electrodes of the second electrode layer respectively disposed on two of the areas opposed along the first-diagonal-line direction, and the two divided electrodes of the first feed electrode layer respectively disposed on two of the areas opposed along the second-diagonal-line direction are connected through an external electrode disposed on the outer surface of the piezoelectric element to the two divided electrodes of the second electrode layer respectively disposed on two of the areas opposed along the second-diagonal-line direction.

EFFECTS OF THE INVENTION

According to the present invention, two of four divided electrodes of a first feed electrode layer disposed on two areas opposed along a first-diagonal-line direction of a principal surface of an associated one of piezoelectric layers are connected through a first connection electrode to each other, and two of four divided electrodes of a second feed electrode layer disposed on two areas opposed along a second-diagonal-line direction of the principal surface of an associated one of the piezoelectric layers are connected through a second connection electrode to each other. This can reduce the number of wires or the like. As a result, vibration of a piezoelectric element can be restrained from being inhibited.

Furthermore, the number of man hours for connection between the wires or the like and the external electrodes can be reduced, thereby facilitating fabrication of an ultrasonic actuator. In particular, the piezoelectric element is mechanically weak. Therefore, when the wires or the like are connected to the external electrodes, mechanical stresses may lead to the broken piezoelectric element. However, when, as described above, the number of man hours for connection between the wires or the like and the external electrodes is reduced, the piezoelectric element is restrained from being broken in this connection process step.

Moreover, the number of the junction points between the wires or the like and the external electrodes can be reduced. This can improve the reliability of the ultrasonic actuator.

In addition, since the first and second connection electrodes are formed on parts of longitudinally middle parts of the associated piezoelectric layers except both transverse end parts of the associated piezoelectric layers, respectively, this can increase the area of each electrode on stress concentration part of the associated piezoelectric layer on which stresses arising from a primary mode of a stretching vibration are concentrated. Thus, even with a miniaturization in the size of a piezoelectric element, a strong stretching vibration can be achieved.

Additionally, according to the above-mentioned configuration, the first and second feed electrode layers are each formed on the stress concentration part on which stresses arising from vibrations are concentrated and prevented from being formed on part of the associated piezoelectric layer which hardly contributes to vibrations except the stress concentration part. This can reduce power consumption in part of the piezoelectric element in which stress arising from vibrations is hardly generated.

Figure 1:
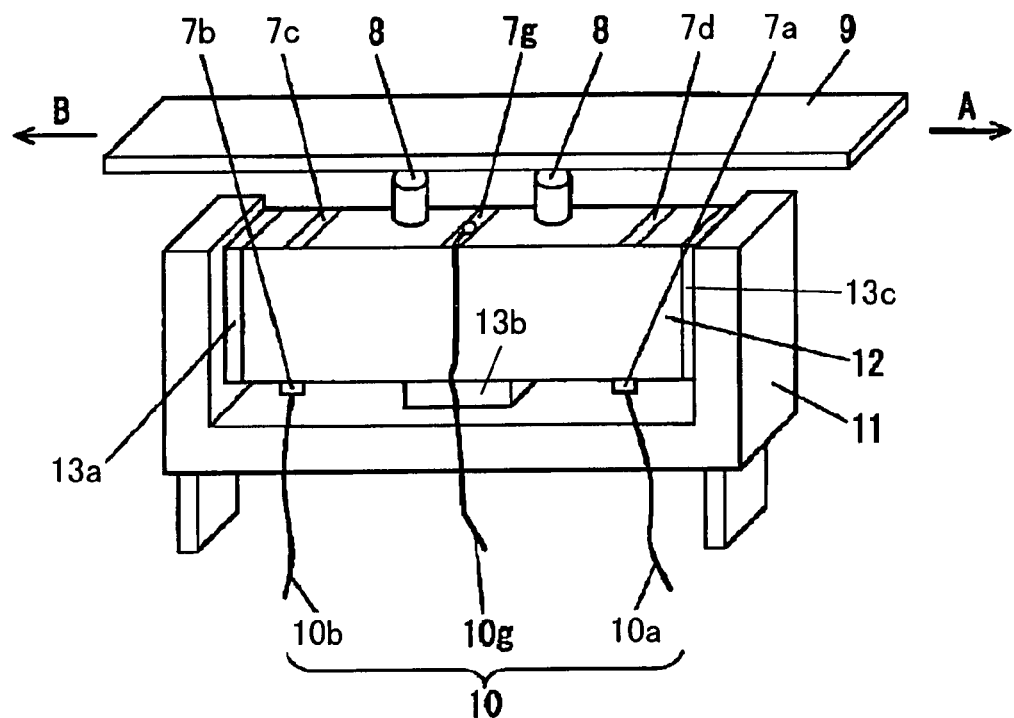
FIG. 1 is a perspective view of an ultrasonic actuator according to an embodiment of the present invention.

DESCRIPTION OF REFERENCE NUMERALS 1 piezoelectric layer
2a through 2d divided electrodes
2e first connection electrode
2f lead electrode
3 common electrode layer
4a through 4d divided electrodes
4e second connection electrode
4f lead electrode
5 internal electrode
6 feed electrode layer
6a first feed electrode layer
6b second feed electrode layer
7a through 7d external electrodes
7g external electrode for common electrode
8 driver
9 movable object
10 wire
11 case
12, 23, 43 piezoelectric elements
13 through 13c supporting members

BEST MODE FOR CARRYING OUT THE INVENTION

An embodiment of the present invention will be described hereinafter in details with reference to the drawings.

—Structure of Ultrasonic Actuator—

Figure 2:
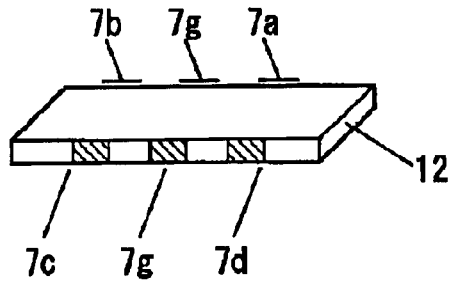
FIG. 2 is a perspective view of a piezoelectric element.
Figure 3:
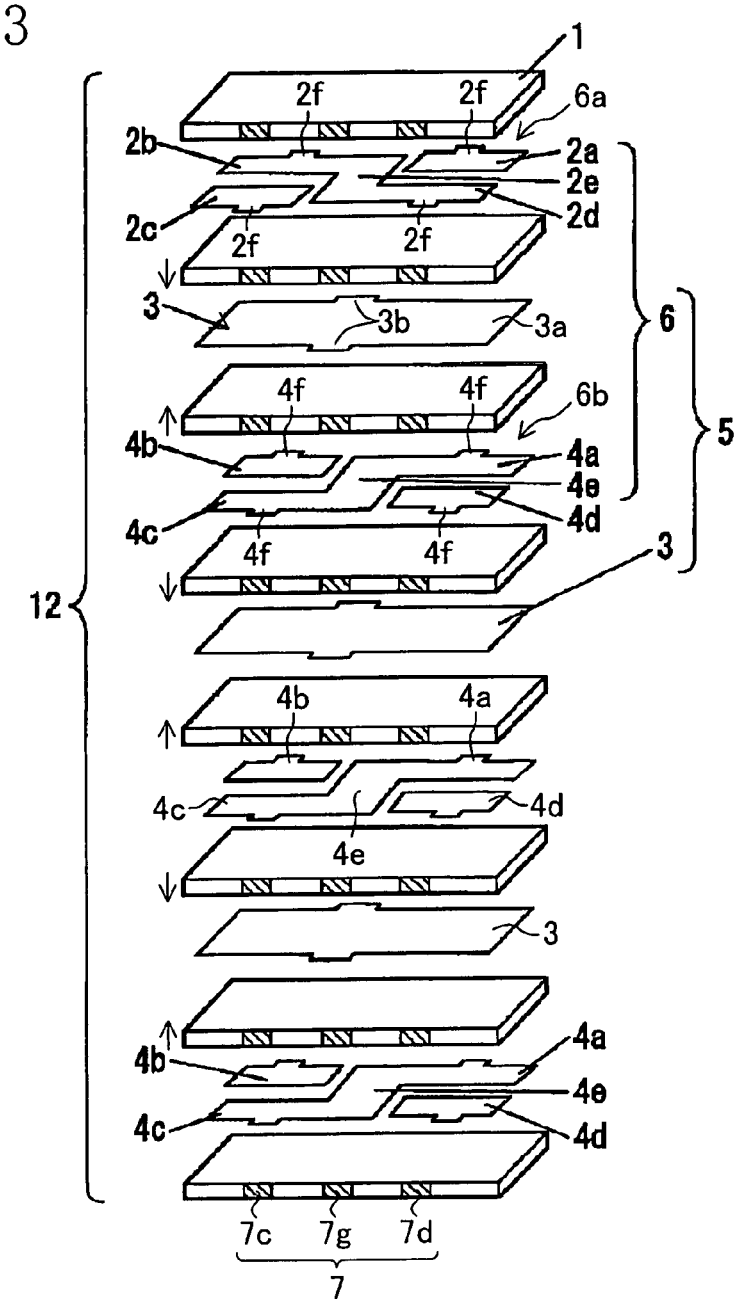
FIG. 3 is an exploded perspective view of the piezoelectric element.
Figure 4:
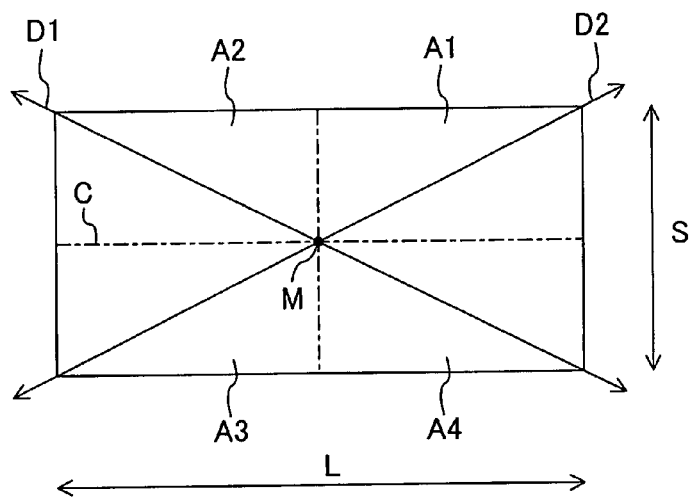
FIG. 4 is a plan view of a piezoelectric layer.
Figure 5A:
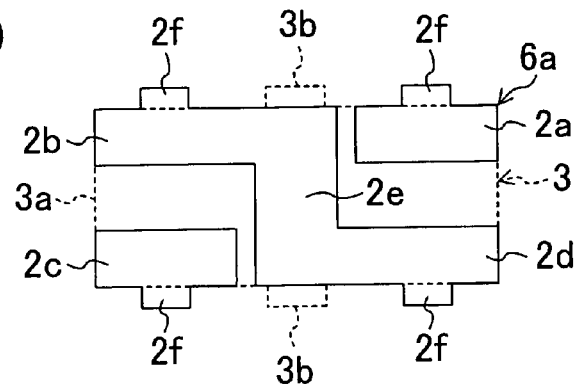
FIG. 5(a) is a diagram illustrating the spatial relationship between a first feed electrode layer and a common electrode layer.
Figure 5B:
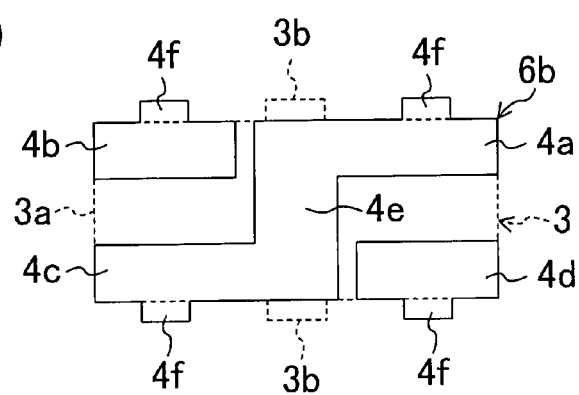
FIG. 5(b) is a diagram illustrating the spatial relationship between a second feed electrode layer and a common electrode layer.

FIG. 1 is a perspective view of an ultrasonic actuator according to this embodiment. FIG. 2 is a perspective view of a piezoelectric element 12 for use in the ultrasonic actuator. FIG. 3 is an exploded perspective view of the piezoelectric element 12. FIG. 4 is a plan view of a piezoelectric layer 1. FIG. 5(a) is a diagram illustrating the spatial relationship between a first feed electrode layer 6a and a common electrode layer 3, and FIG. 5(b) is a diagram illustrating the spatial relationship between a second feed electrode layer 6b and a common electrode layer 3.

As illustrated in FIGS. 1 through 3, the ultrasonic actuator includes a piezoelectric element 12. The piezoelectric element 12 has a pair of opposed principal surfaces, a pair of opposed end surfaces which are perpendicular to the principal surfaces and extend in the longitudinal direction of each principal surface of the piezoelectric element 12, and a pair of opposed side surfaces which are perpendicular to both the principal and end surfaces and extend in the transverse direction of each principal surface thereof. The principal, end and side surfaces form the outer surfaces of the piezoelectric element 12, and the end and side surfaces form the surrounding surfaces thereof. In this embodiment, the principal surfaces each have the largest area among the principal, end and side surfaces.

The piezoelectric element 12 is contained inside a case 11 (supporter) and supported by the case 11 with three supporting members 13a through 13c interposed therebetween. Drivers 8, 8 are disposed on one of the end surfaces of the piezoelectric element 12 to support a flat movable object 9. The supporting member 13b disposed on the other end surface of the piezoelectric element 12 (the end surface opposite to the end surface on which the drivers 8, 8 are disposed) presses the drivers 8, 8 against the movable object 9. This press increases the friction force between the distal ends of the drivers 8, 8 and the movable object 9, thereby transmitting vibration of the piezoelectric element 12 through the drivers 8, 8 to the movable object 9 with reliability.

The piezoelectric element 12 forms the shape of a generally rectangular parallelepiped and is obtained by alternately stacking generally rectangular piezoelectric layers 1 and internal electrode layers 5. Each piezoelectric layer 1 is an insulator layer made of a ceramic material, such as lead zirconium titanate. The internal electrode layers 5 include common electrode layers 3 and feed electrode layers 6 which are alternately arranged along the stacking direction of layers (along the thickness of the piezoelectric element 12) with the piezoelectric layers 1 interposed between the common electrode layers 3 and adjacent feed electrode layers 6. Each common electrode layer 3 has a generally rectangular common electrode 3a substantially entirely formed on the upper principal surface of the associated piezoelectric layer 1. The common electrode 3a is formed with lead electrodes 3b, 3b extending from a longitudinally middle part of the common electrode 3a toward both end surfaces of the piezoelectric element 12. Common electrodes 3a on different piezoelectric layers 1 are electrically continuous through associated lead electrodes 3b and external electrodes 7g for the common electrodes. The external electrodes 7g are disposed on both end surfaces of the piezoelectric element 12, respectively.

The feed electrode layers 6 include a first feed electrode layer 6a disposed on the upper principal surface of the associated piezoelectric layer 1 and a second feed electrode layer 6b disposed on the upper principal surface of the associated piezoelectric layer 1 different from the piezoelectric layer 1 on which the first feed electrode layer 6a is disposed. In other words, any one of the common electrode layers 3, the first feed electrode layer 6a and the second feed electrode layer 6b is printed on one of the principal surfaces of each piezoelectric layer 1. Furthermore, as illustrated by the arrows in FIG. 3, the piezoelectric layer 1 is polarized in the direction going from an associated one of the first feed electrode layer 6a and the second feed electrode layer 6b toward the associated common electrode layer 3.

The first feed electrode layer 6a has four divided electrodes 2a through 2d which are respectively formed on four areas A1 through A4 (see FIG. 4) defined by dividing the upper principal surface of the associated piezoelectric layer 1 into two equal parts in both the longitudinal and transverse directions L and S of the upper principal surface and a first connection electrode 2c for providing connection between a pair of the divided electrodes 2b and 2d respectively formed on two areas A2 and A4 opposed along the first-diagonal-line direction D1 of a first diagonal line across the upper principal surface of the associated piezoelectric layer 1 among the four divided electrodes 2a through 2d.

The divided electrodes 2a through 2d are generally rectangular electrodes and overlap the associated common electrode layer 3 when viewed in the stacking direction (see FIG. 5(a)). In other words, the divided electrodes 2a through 2d are opposed to the associated common electrode layer 3 with the associated piezoelectric layer 1 interposed therebetween. The divided electrodes 2a through 2d are formed with lead electrodes 2f extending from respective longitudinally middle parts of the divided electrodes 2a through 2d toward the associated end surfaces of the piezoelectric element 12. The lead electrodes 2f do not overlap the associated common electrode layer 3 when viewed in the stacking direction (see FIG. 5(a)). In other words, the lead electrodes 2f are not opposed to the associated common electrode layer 3. This prevents an electric field from being generated in parts of the piezoelectric layer 1 opposed to the lead electrodes 2f. In other words, the parts of the piezoelectric layer 1 become piezoelectrically inactive. The divided electrodes 2a through 2d are connected through the lead electrodes 2f to external electrodes 7a through 7d, respectively. The external electrodes 7c and 7d are disposed on one of the end surfaces of the piezoelectric element 12, and the external electrodes 7a and 7b are disposed on the other end surface thereof.

The first connection electrode 2e is substantially entirely formed on the upper principal surface of a part of a longitudinally middle part of the piezoelectric layer 1 except transverse end parts thereof, and overlaps the associated common electrode layer 3 when viewed in the stacking direction (see FIG. 5(a)).

The second feed electrode layer 6b has four divided electrodes 4a through 4d which are respectively formed on four areas A1 through A4 defined by dividing the upper principal surface of the associated piezoelectric layer 1 into two equal parts in both the longitudinal and transverse directions L and S, and a second connection electrode 4e for providing connection between a pair of the divided electrodes 4a and 4c respectively formed on two areas A1 and A3 opposed along the second-diagonal-line direction D2 of a second diagonal line across the upper principal surface of the associated piezoelectric layer 1 among the four divided electrodes 4a through 4d.

The divided electrodes 4a through 4d are generally rectangular electrodes and overlap the associated common electrode layer 3 when viewed in the stacking direction (see FIG. 5(b)). The divided electrodes 4a through 4d are formed with lead electrodes 4f extending from respective longitudinally middle parts of the divided electrodes 4a through 4d toward the associated end surfaces of the piezoelectric element 12. The lead electrodes 4f do not overlap the associated common electrode layer 3 when viewed in the stacking direction (see FIG. 5(b)). This prevents an electric field from being generated in parts of the piezoelectric layer 1 opposed to the lead electrodes 4f. The divided electrodes 4a through 4d are connected through the lead electrodes 4f to external electrodes 7a through 7d, respectively. In view of the above, the divided electrodes 2a through 2d of the first feed electrode layer 6a are connected through the external electrodes 7a through 7d to the divided electrodes 4a through 4d of the second feed electrode layer 6b opposed to the divided electrodes 2a through 2d.

The second connection electrode 4e is substantially entirely formed on the upper principal surface of a part of a longitudinally middle part of the associated piezoelectric layer 1 except transverse end parts thereof, and overlaps the associated common electrode layer 3 when viewed in the stacking direction (see FIG. 5(b)).

As described above, the divided electrodes 2b and 2d of the first feed electrode layer 6a are connected through the first connection electrode 2c to each other. The divided electrode 2b of the first feed electrode layer 6a is connected through the external electrode 7b to the divided electrode 4b of the second feed electrode layer 6b formed on one A2 of the two areas A2 and A4, and the divided electrode 2d of the first feed electrode layer 6a is connected through the external electrode 7d to the divided electrode 4d of the second feed electrode layer 6b formed on the other one A4 of the two areas A2 and A4. In other words, the divided electrodes 2b and 2d of the first feed electrode layer 6a on one of the piezoelectric layers 1 are connected through the external electrodes 7b and 7d to the divided electrodes 4b and 4d of the second feed electrode 6b on another one of the piezoelectric layers 1. Thus, the divided electrodes 2b and 2d of the first feed electrode layer 6a and the divided electrodes 4b and 4d of the second feed electrode layer 6b are at the same potential.

Furthermore, the divided electrodes 4a and 4c of the second feed electrode layer 6b are connected through the second connection electrode 4e to each other. The divided electrode 4a of the second feed electrode layer 6b is connected through the external electrode 7a to the divided electrode 2a of the first feed electrode layer 6a formed on one A1 of the two areas A1 and A3, and the divided electrode 4c of the second feed electrode layer 6b is connected through the external electrode 7c to the divided electrode 2c of the first feed electrode layer 6a formed on the other one A3 of the two areas A1 and A3. In other words, the divided electrodes 2b and 2d of the first feed electrode layer 6a on one of the piezoelectric layers 1 are connected through the external electrodes 7b and 7d to the divided electrodes 4b and 4d of the second feed electrode 6b on another one of the piezoelectric layers 1. Thus, the divided electrodes 2a and 2c of the first feed electrode layer 6a and the divided electrodes 4a and 4c of the second feed electrode layer 6b are at the same potential.

Wires 10 are connected through solders to the external electrodes 7a, 7b, and 7g. Thus, voltages are applied through the wires 10 to the internal electrode layers 5 to vibrate the piezoelectric element 12.

Meanwhile, the resonance frequencies of stretching and bending vibrations of the piezoelectric element 12 are determined by the material and shape of the piezoelectric element 12 and other factors. The material and shape of the piezoelectric element 12 and other factors are determined such that the resonance frequency of the stretching vibration generally coincides with that of the bending vibration. In this embodiment, the material and shape of the piezoelectric element 12 and other factors are determined such that the resonance frequency of the primary mode of the stretching vibration generally coincides with that of the secondary mode of the bending vibration.

As described above, two of a total of four external electrodes 7a through 7d need to be formed on each end surface of the piezoelectric element 12. However, only the external electrodes 7 formed on one of the end surfaces of the piezoelectric element 12 need to be connected to wires 10. In view of the above, the piezoelectric element 12 is connected to the wires 10 at the following three locations: a total of two locations between one of the external electrodes 7a and 7c and an associated one of the wires 10 (in this embodiment, between the external electrode 7a and the associated wire 10) and between one of the external electrodes 7b and 7d and an associated one of the wires 10 (in this embodiment, between the external electrode 7b and the associated wire 10) and one location between the external electrode 7g for the common electrodes and an associated one of the wires 10. This can reduce the number of the wires 10 to be connected to the external electrodes 7 to three. As a result, vibration of the piezoelectric element 12 can be restrained from being inhibited, thereby suppressing a reduction in the efficiency of the ultrasonic actuator.

Furthermore, the number of man hours for connection between the wires 10 and the external electrodes 7 can be reduced, thereby facilitating fabrication of an ultrasonic actuator. In particular, the piezoelectric element 12 is mechanically weak. Therefore, when the wires 10 are connected to the external electrodes 7, mechanical stresses may lead to the broken piezoelectric element 12. When, to cope with this, the number of man hours for connection between the wires 10 and the external electrodes 7 is reduced as described above, the piezoelectric element 12 is restrained from being broken in this connection process step.

Moreover, the number of the junction points between the wires 10 and the external electrodes 7 can be reduced. This reduction can restrain the solders disposed on the junction points from inhibiting vibration of the piezoelectric element 12. Furthermore, these junction points are significant sections of the ultrasonic actuator for driving the ultrasonic actuator and susceptible to the external environment, such as variations in humidity and temperature. Therefore, when, as described above, the number of the junction points is reduced, this can improve the reliability of the ultrasonic actuator.

In order to induce a secondary mode of a bending vibration with high efficiency, a pair of electrodes disposed on diagonal parts of the upper principal surface of an associated piezoelectric layer 1, respectively, are desirably at the same potential. To satisfy this, as described above, the divided electrodes 2b and 2d of the first feed electrode layer 6a are electrically connected through the external electrodes 7b and 7d to the divided electrodes 4b and 4d of the second feed electrode layer 6b so that the divided electrodes 2b, 2d, 4b, and 4d are at the same potential, and the divided electrodes 4a and 4c of the second feed electrode layer 6b are electrically connected through the external electrodes 7a and 7c to the divided electrodes 2a and 2c of the first feed electrode layer 6a so that the divided electrodes 4a, 4c, 2a, and 2c are at the same potential. Consequently, a pair of electrodes disposed on diagonal parts of the upper principal surface of a piezoelectric layer 1 can be at the same potential.

Furthermore, external electrodes 7g are formed on both end surfaces of the piezoelectric element 12, respectively. Therefore, the directivity of the piezoelectric element 12 is eliminated, thereby eliminating the need for appropriately adjusting the locations of the drivers 8, 8 and the piezoelectric element 12 when drivers 8, 8 are placed on the piezoelectric element 12. As a result, the number of ultrasonic actuators produced is increased. An external electrode 7g may be formed only on one end surface of the piezoelectric element 12.

In addition, the common electrodes 3a, the divided electrodes 2a through 2d of the first feed electrode layer 6a, and the divided electrodes 4a through 4d of the second feed electrode layer 6b are connected through the lead electrodes 3b, 2f, and 4f to the associated external electrodes 7a through 7d and 7g, respectively. Therefore, the common electrodes 3a, the divided electrodes 2a through 2d of the first feed electrode layer 6a, and the divided electrodes 4a through 4d of the second feed electrode layer 6b can be extended toward different parts of the surrounding surfaces of the piezoelectric element 12. This can ensure sufficiently large insulating distances between vertically adjacent ones of the common electrodes 3, the divided electrodes 2a through 2d of the first feed electrode layer 6a, and the divided electrodes 4a through 4d of the second feed electrode layer 6b. In view of the above, in order to provide sufficiently large insulating distances, the respective lead electrodes 3b, 2f and 4f of the electrodes 3a, 2a through 2d and 4a through 4d of different potentials are desirably spaced at intervals larger than the thickness of each piezoelectric layer 1.

Since, as described above, the common electrodes 3a, the divided electrodes 2a through 2d of the first feed electrode layer 6a, and the divided electrodes 4a through 4d of the second feed electrode layer 6b are connected to the external electrodes 7a through 7d and 7g through the lead electrodes 3b, 2f and 4f placed on respective piezoelectrically inactive parts of the associated piezoelectric layers 1, this prevents the piezoelectric element 12 from unnecessarily vibrating. As a result, the piezoelectric element 12 vibrates in a balanced manner, resulting in the improved vibration efficiency.

Since, as described above, the first connection electrode 2e and the second connection electrode 4e are formed on parts of longitudinally middle parts of the associated piezoelectric layers 1 except transverse end parts thereof, respectively, this can increase the area of each electrode on the longitudinally middle part of the associated piezoelectric layer 1. The longitudinally middle part of the piezoelectric layer 1 is the node of a primary mode of a stretching vibration, that is, the stress concentration part of the piezoelectric layer 1 on which stresses arising from the stretching vibration are concentrated. Charges generated by a piezoelectric effect are concentrated on the stress concentration part. When, as described above, the area of an electrode on this stress concentration part is increased, a strong stretching vibration can be induced even with a miniaturization in the size of the piezoelectric element 12. As a result, the efficiency of the ultrasonic actuator can be improved.

Meanwhile, with an increase in the area of each of the first connection electrode 2e and the second connection electrode 4e, a stronger stretching vibration occurs. When the area of the electrode is too large, this inhibits a secondary mode of a bending vibration. To cope with this, the width of each of the first connection electrode 2e and the second connection electrode 4e is desirably approximately 5% through 40% of the longitudinal length of the associated piezoelectric layer 1.

Meanwhile, it would be ideal if each of the first connection electrode 2e and the second connection electrode 4e is substantially entirely formed on the associated piezoelectric layer 1 along the transverse direction of the associated piezoelectric layer 1. However, when each of the first connection electrode 2e and the second connection electrode 4c is formed to reach the transverse ends of the associated piezoelectric layer 1, the internal electrode layers 5 are hardly isolated from one another. To cope with this, as described above, the first connection electrode 2e and the second connection electrode 4e are formed on parts of the associated piezoelectric layers 1 except transverse end parts thereof. To be specific, the first connection electrode 2e and the second connection electrode 4e are each desirably formed on a region of the associated piezoelectric layer 1 except regions thereof having a width equal to the thickness of the associated piezoelectric layer 1 from both the transverse ends thereof toward the transversely middle thereof.

Feed electrode layers 6 and other layers will be further described hereinafter.

Divided electrodes 2a through 2d of a first feed electrode layer 6a and divided electrodes 4a through 4d of a second feed electrode layer 6b are formed on parts of associated piezoelectric layers 1 except both longitudinal end parts thereof. These divided electrodes 2a through 2d and 4a through 4d and connection electrodes 2e and 4e represent parts of the feed electrode layers 6 overlapping associated common electrodes 3a when viewed in the stacking direction (see FIG. 5). In other words, parts of the feed electrode layers 6 that do not overlap the common electrode 3a when viewed in the stacking direction do not form the divided electrodes 2a through 2d and 4a through 4d and the connection electrodes 2e and 4e but form lead electrodes 2f and 4f.

Meanwhile, both longitudinal end parts of each piezoelectric layer 1 are located far away from stress concentration part thereof on which stresses arising from a primary mode of a stretching vibration are concentrated. Therefore, stress is hardly produced on the longitudinal end parts of the piezoelectric layer 1. When electrodes are formed on the parts of the piezoelectric layer 1 on which stress is hardly produced, power supplied through the electrodes is not converted into vibrations with high efficiency. Therefore, electrical loss is more likely to be caused. In view of the above, in order to convert the supplied power into vibrations with high efficiency, as described above, electrodes are formed on and in the vicinity of the stress concentration part on which stresses arising from a stretching vibration are concentrated, and electrodes are prevented from being formed on the other parts on which stress is hardly produced. More specifically, the divided electrodes 2a through 2d of the first feed electrode layer 6a and the divided electrodes 4a through 4d of the second feed electrode layer 6b are each preferably formed on a region of an associated piezoelectric layer 1 except regions thereof each having a length equal to 10% of the longitudinal length of the associated piezoelectric layer 1 from the associated longitudinal end thereof toward the longitudinally middle thereof, and they are each more preferably formed on a region of an associated piezoelectric layer 1 except regions thereof each having a length equal to 20% of the longitudinal length of the associated piezoelectric layer 1 from the associated longitudinal end thereof toward the longitudinally middle thereof. In this manner, a primary mode of a stretching vibration can be more strongly induced, resulting in the efficiency of the ultrasonic actuator improved.

The divided electrodes 2a through 2d of the first feed electrode layer 6a and the divided electrodes 4a through 4d of the second feed electrode layer 6b are formed on parts of the associated piezoelectric layers 1 except transversely middle parts thereof.

Meanwhile, the transversely middle part of each piezoelectric layer 1 is located far away from the stress concentration part on which stresses arising from a secondary mode of a bending vibration are concentrated (both transverse end parts of the piezoelectric layer 1). Therefore, stress is hardly produced. When electrodes are formed on the parts of the piezoelectric layer 1 on which stress is hardly produced, power supplied through the electrodes is not converted into vibrations with high efficiency. Therefore, electrical loss is more likely to be caused. In view of the above, in order to convert the supplied power into vibrations with high efficiency, as described above, electrodes are formed on and in the vicinity of the stress concentration part on which stresses arising from a bending vibration are concentrated, and electrodes are prevented from being formed on the other parts on which stress is hardly produced. More specifically, the divided electrodes 2a through 2d of the first feed electrode layer 6a and the divided electrodes 4a through 4d of the second feed electrode layer 6b are each preferably formed on a region of an associated piezoelectric layer 1 except regions thereof each having a length equal to 10% of the transverse length of the associated piezoelectric layer 1 from the transversely middle thereof toward the associated transverse end thereof, and they are each more preferably formed on a region of the associated piezoelectric layer 1 except regions thereof each having a length equal to 20% of the transverse length of the associated piezoelectric layer 1 from the transversely middle thereof toward the associated transverse end thereof. In this manner, a secondary mode of a bending vibration can be more strongly induced, resulting in the efficiency of the ultrasonic actuator improved.

The shape of a part of each of first feed electrode layers 6a formed of divided electrodes 2a through 2d and a first connection electrode 2e is point-symmetric with respect to the central point M on the upper principal surface of an associated piezoelectric layer 1 (see FIG. 4). The shape of a part of each of second feed electrode layers 6b formed of divided electrodes 4a through 4d and a second connection electrode 4e is also point-symmetric with respect to the central point M on the upper principal surface of another associated piezoelectric layer 1. In other words, the shape of a part of the first feed electrode layer 6a other than lead electrodes 2f and the shape of a part of the second feed electrode layer 6b other than lead electrodes 4f are each point-symmetric with respect to an intersection point of the first and second diagonal lines of the upper principal surface of the associated piezoelectric layer 1. When, as described above, the shape of each feed electrode layer 6 is generally point-symmetric with respect to the central point M on the upper principal surface of the associated piezoelectric layer 1, this improves the symmetry of the vibration of the piezoelectric element 12, in particular, the secondary mode of the bending vibration. This improvement prevents the piezoelectric element 12 from unnecessarily vibrating, resulting in sharply reduced energy loss. This reduction allows supplied power to be converted into vibrations with high efficiency.

The shape of the part of the first feed electrode layer 6a formed of the divided electrodes 2a through 2d and the first connection electrode 2e and the shape of the part of the second feed electrode layer 6b formed of the divided electrodes 4a through 4d and the second connection electrode 4e are identical with each other but inverse to each other with respect to the central line C (see FIG. 4) extending along the longitudinal direction L of the upper principal surface of each piezoelectric layer 1. In other words, the shape obtained by inverting the shape of the part of the first feed electrode layer 6a other than the lead electrodes 2f with respect to the central line C corresponds to the shape of the part of the second feed electrode layer 6b other than the lead electrodes 4f. When, as described above, the shape of the first feed electrode layer 6a and the shape of the second feed electrode layer 6b are identical with each other but inverse to each other with respect to the central line C, this improves the symmetry of the vibration of the piezoelectric element 12, in particular, the secondary mode of the bending vibration. This improvement prevents the piezoelectric element 12 from unnecessarily vibrating, resulting in sharply reduced energy loss. This reduction allows supplied power to be converted into vibrations with high efficiency.

The outermost layers of the piezoelectric element 12 in the stacking direction are piezoelectric layers 1. This provides the following effects. More particularly, on condition that a small ultrasonic actuator (for example, having a length of approximately 1 mm through 20 mm) is implemented in a very small space inside an electronic device, if the outermost layers of the piezoelectric element 12 are common electrode layers 3 or feed electrode layers 6, contact between the principal surfaces of the piezoelectric element 12 and a metal component around the principal surfaces thereof may cause a short circuit between the outermost electrode layers and the metal component. This short circuit may significantly degrade the characteristics of the ultrasonic actuator. When, to cope with this, as described above, the outermost layers of the piezoelectric element 12 in the stacking direction are piezoelectric layers 1 being insulators, this prevents a short circuit from being caused even with contact between the principal surfaces of the piezoelectric element 12 and a metal component. As a result, the reliability of the ultrasonic actuator can be improved.

—Operation of Ultrasonic Actuator—

Figure 6:
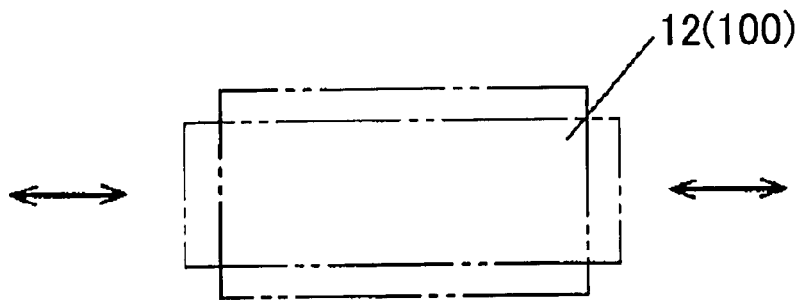
FIG. 6 is a displacement diagram of a primary mode of a stretching vibration.
Figure 7:
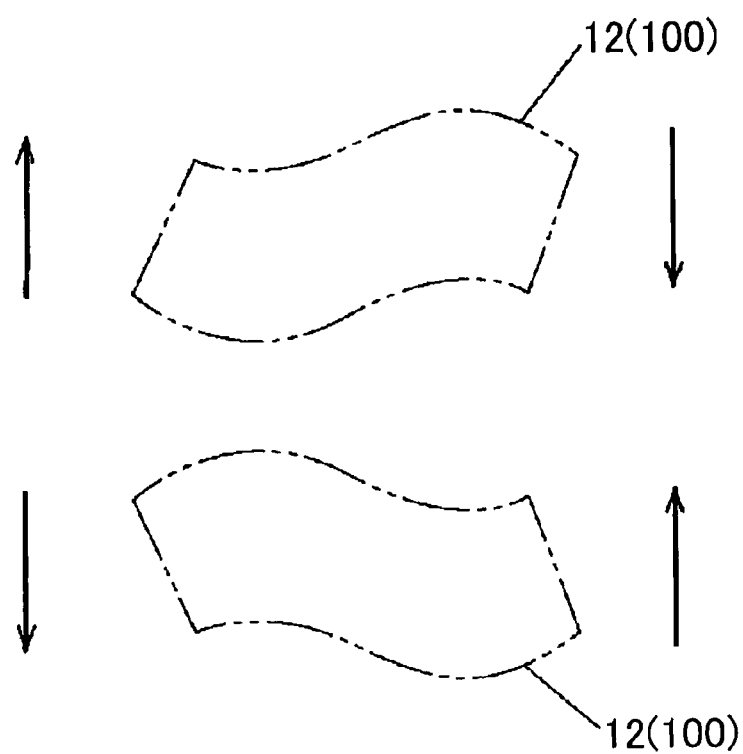
FIG. 7 is a displacement diagram of a secondary mode of a bending vibration.
Figure 8B:
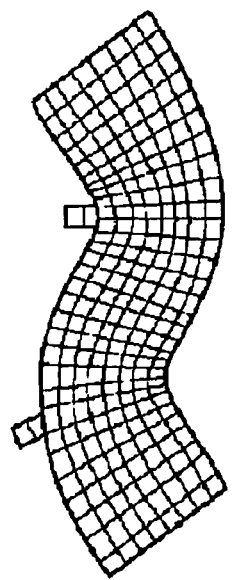
FIG. 8 are conceptual diagrams for explaining the motions of a piezoelectric element.
Figure 8D:
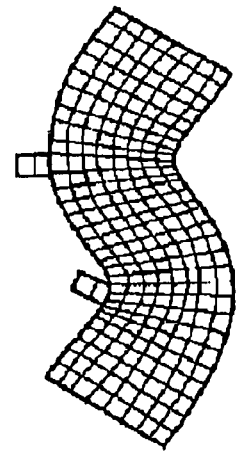
Figure 8A:
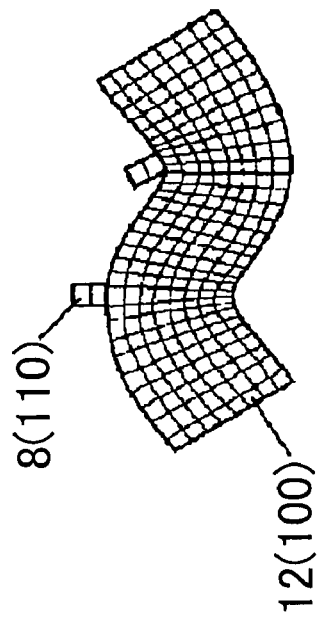
Figure 8C:
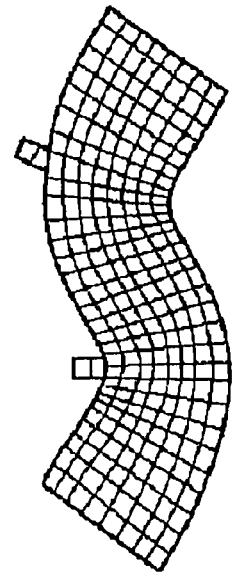

The operation of an ultrasonic actuator will be described hereinafter. FIG. 6 is a displacement diagram of a primary mode of a stretching vibration according to this embodiment. FIG. 7 is a displacement diagram of a secondary mode of a bending vibration. FIG. 8 are conceptual diagrams for explaining the motions of a piezoelectric element 12. In FIGS. 6 through 8, the principal surfaces of the piezoelectric element 12 are parallel to the papers of the drawings.

For example, when a reference alternating voltage of a frequency close to the two generally coinciding resonance frequencies is applied through a wire 10 between a common electrode layer 3 and an associated first feed electrode layer 6a, and the alternating voltage that is 90° or −90° out of phase with the reference alternating voltage and has substantially the same magnitude and frequency as the reference alternating voltage is applied through another wire 10 between the common electrode layer 3 and an associated second feed electrode layer 6b, the primary mode of the stretching vibration illustrated in FIG. 6 and the secondary mode of the bending vibration illustrated in FIG. 7 are harmonically induced in the piezoelectric element 12.

This induction causes variations in the shape of the piezoelectric element 12 as illustrated in FIGS. 8(a), 8(b), 8(c), and 8(d) in this order. As a result, the drivers 8, 8 placed on the piezoelectric element 12 each produce a generally elliptical motion when viewed from the front of the paper of the drawing in FIG. 8. More particularly, the synthesis of the bending and stretching vibrations of the piezoelectric element 12 allows the drivers 8, 8 to each produce an elliptical motion. This elliptical motion allows the movable object 9 supported by the drivers 8, 8 to move relative to the piezoelectric element 12 in the direction shown by the arrow A or B in FIG. 1.

The direction in which the piezoelectric element 12 is stretched by the stretching vibration corresponds to the longitudinal direction of the principal surfaces of the piezoelectric element 12, i.e., the direction in which the movable object 9 can move. The direction of the bending vibration corresponds to the direction in which the drivers 8, 8 supports the movable object 9. The stacking direction in which layers forming the piezoelectric element 12 are stacked corresponds to the direction vertical to both the direction in which the piezoelectric element 12 is stretched by the stretching vibration and the direction of the bending vibration.

OTHER EMBODIMENTS

Figure 9:
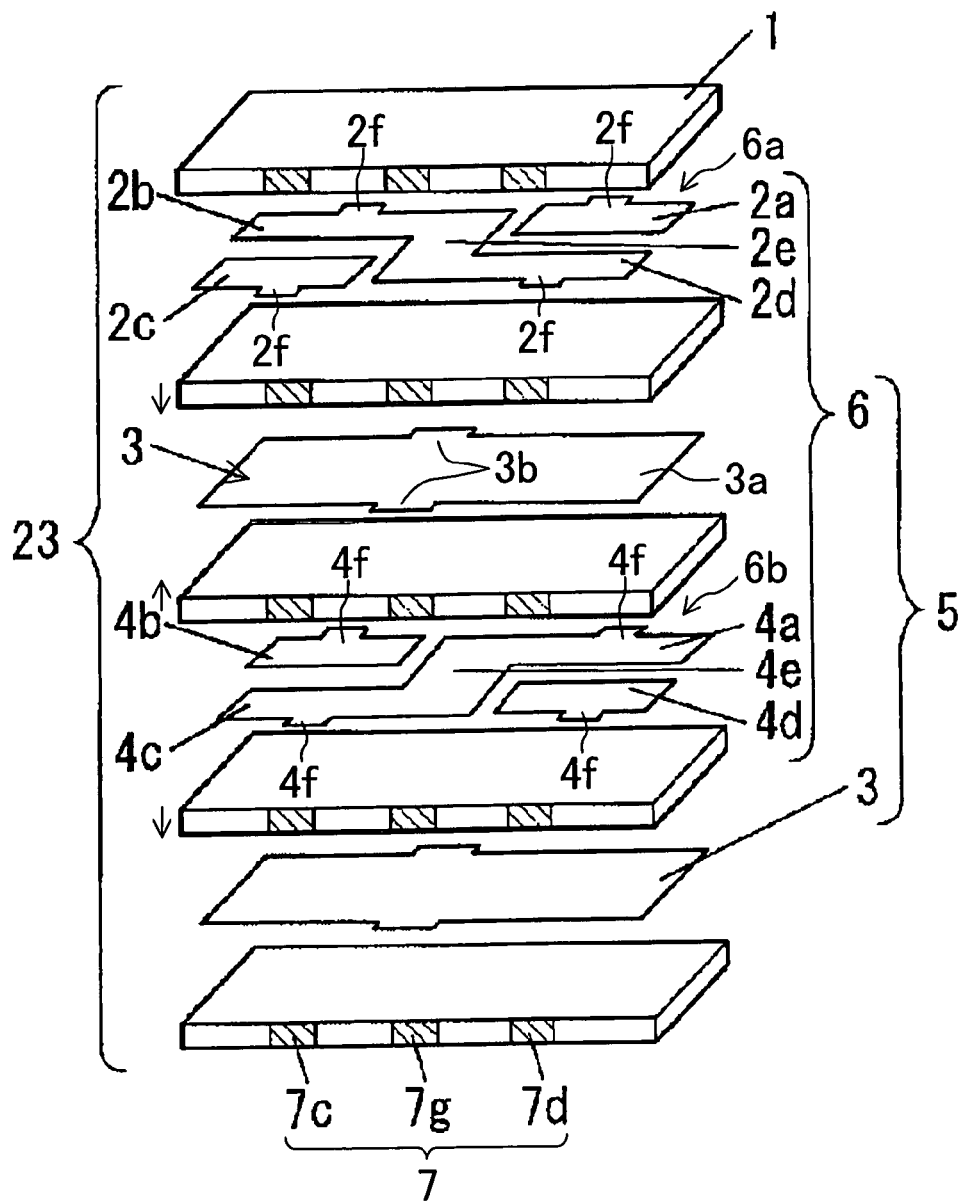
FIG. 9 is an exploded perspective view of a modification of an ultrasonic actuator.

In the above embodiment, as illustrated in FIG. 3, the feed electrode layers 6 may be configured such that several first feed electrode layers 6a or several second feed electrode layers 6b are successively placed in the stacking direction. Alternatively, first feed electrode layers 6a and second feed electrode layers 6b may be randomly placed. However, as illustrated in FIG. 9, the number of first feed electrode layers 6a is desirably equal to that of second feed electrode layers 6b, and feed electrode layers 6 is desirably configured such that the first feed electrode layers 6a and the second feed electrode layers 6b are alternately placed.

When the number of the first feed electrode layers 6a is equal to that of the second feed electrode layers 6b, this improves the symmetry of the vibration of the piezoelectric element 12. This improvement prevents the piezoelectric element 12 from unnecessarily vibrating, resulting in sharply reduced energy loss. This reduction allows supplied power to be converted into vibrations with high efficiency.

The feed electrode layers 6 are configured by alternately placing the first feed electrode layers 6a and the second feed electrode layers 6b along the stacking direction. This improves the symmetry of the vibration of a part of the piezoelectric element 12 in which the connection electrodes 2e and 4e are located. This improvement prevents the piezoelectric element 12 from unnecessarily vibrating, resulting in sharply reduced energy loss. This reduction allows supplied power to be converted into vibrations with high efficiency.

In the above embodiment, external electrodes 7 are desirably formed only on the surrounding surfaces of the piezoelectric element 12 so as to be prevented from being formed on the principal surfaces thereof. Since, in this case, external electrodes 7 are not formed on the principal surfaces of the piezoelectric element 12 which have the largest area among the outer surfaces of the piezoelectric element 12, a short circuit becomes less likely to be caused even with contact between the principal surfaces of the piezoelectric elements and a metal component around the principal surfaces. Furthermore, since no electric field is generated between external electrodes 7 and common electrode layers 3, this prevents the piezoelectric element 12 from unnecessarily vibrating, thereby suppressing a reduction in the efficiency of the ultrasonic actuator.

In the above embodiment, divided electrodes 2a through 2d and 4a through 4d are generally rectangular. However, this is not restrictive. These electrodes may be shaped, for example, according to the distribution of stresses due to vibrations.

In the above embodiment, the configuration in which wires 10 are connected through solders to external electrodes 7 was described. However, wires 10 may be connected to external electrodes 7 using any other electrical connection method, such as a connection method using wire bonding, a connection method using a conductive adhesive, a connection method using a crimping method, or a connection method using contact between the wires 10 and the external electrodes 7. This can provide the same effect as in the above embodiment.

In the above embodiment, the case where power is supplied through wires 10 to an ultrasonic actuator was described. However, power may be supplied to an ultrasonic actuator using any other power supply method, such as a method for supplying power through conductive rubber, a method for supplying power through a flexible substrate, or a method for supplying power through a contact pin. This can provide the same effect as in the above embodiment.

Figure 10:
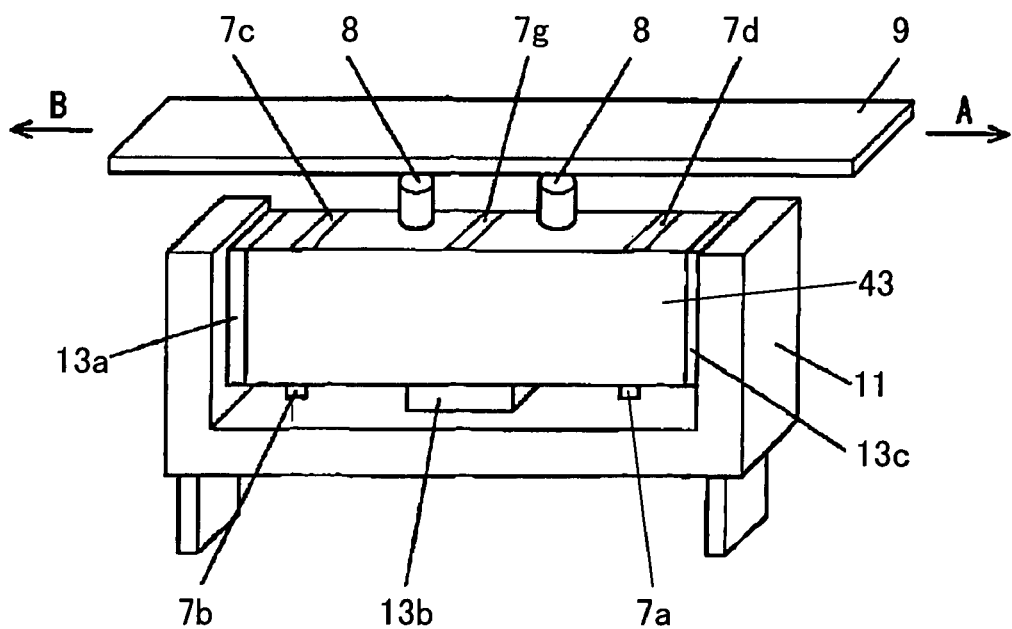
FIG. 10 is a perspective view of a modification of an ultrasonic actuator.
Figure 11A:
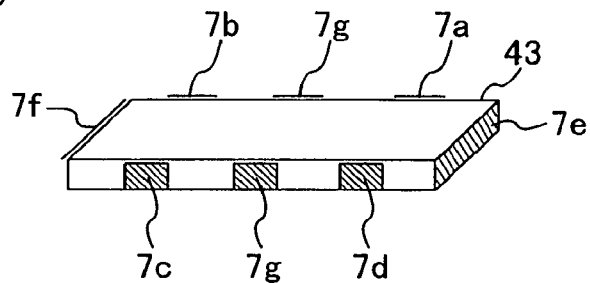
FIG. 11(a) is a perspective view of another piezoelectric element.
Figure 11B:
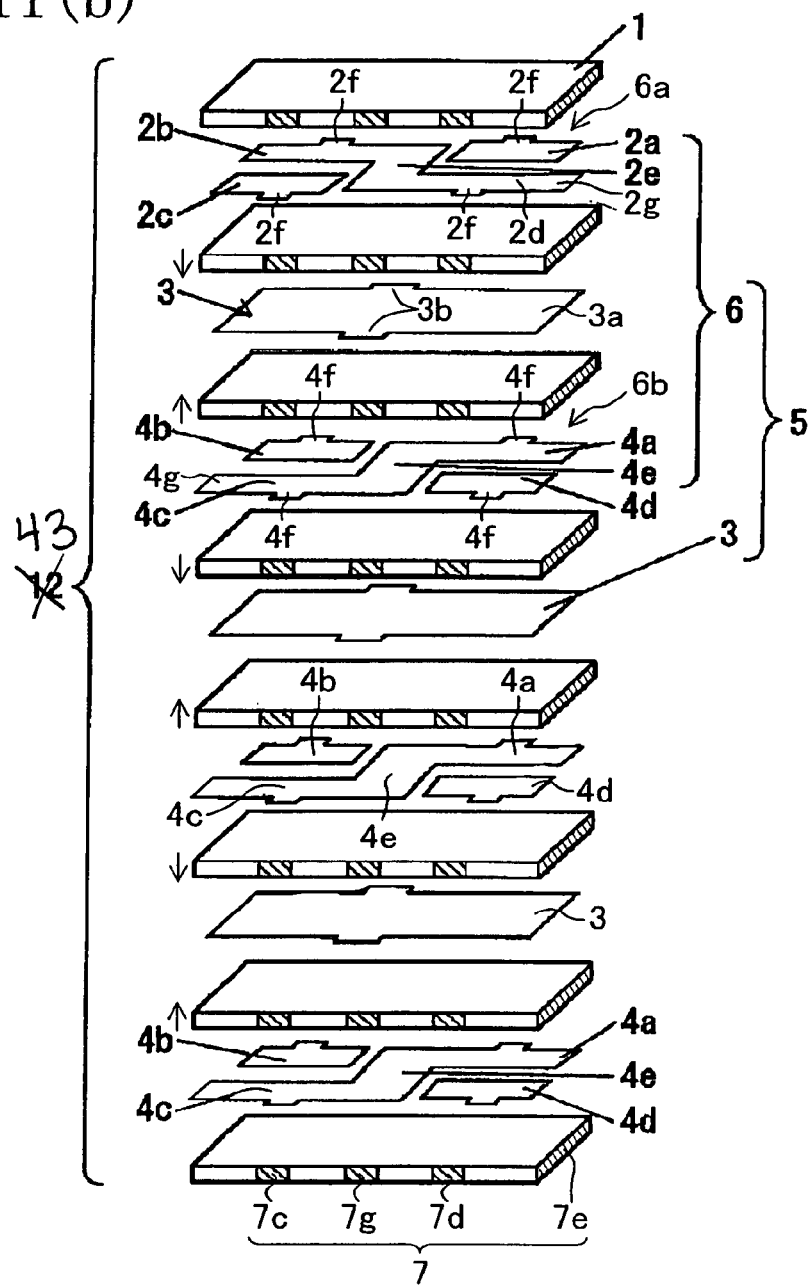
FIG. 11(b) is an exploded perspective view of the piezoelectric element.

An example of power supply through conductive rubber will be described hereinafter. As illustrated in FIGS. 10 and 11, supporting members 13a, 13b, and 13c are made of conductive rubber obtained by mixing metal particles into silicone rubber. A divided electrode 2d of the first feed electrode layer 6a located on an area A4 of an associated piezoelectric layer 1 (see FIG. 4) is provided with a lead electrode 2g extending from the divided electrode 2d toward the associated side surface of a piezoelectric element 43. A divided electrode 4c of the second feed electrode layer 6b located on an area A3 of an associated piezoelectric layer 1 (see FIG. 4) is provided with a lead electrode 4c extending from the divided electrode 4c toward the other associated side surface of the piezoelectric element 43. External electrodes 7e and 7f are disposed on both side surfaces of the piezoelectric element 43, respectively. Common electrodes 3a are connected through one of external electrodes 7g to the supporting member 13b. The divided electrode 2b and 2d of the first feed electrode layer 6a and the divided electrodes 4b and 4d of the second feed electrode layer 6b are connected through the lead electrode 2g and the external electrodes 7e to the supporting member 13c. The divided electrode 2a and 2c of the first feed electrode layer 6a and the divided electrodes 4a and 4c of the second feed electrode layer 6b are connected through the lead electrode 4g and the external electrode 7f to the supporting member 13a. Thus, voltages are applied through these supporting members 13a through 13c and other elements to internal electrode layers 5. This embodiment is substantially the same as the above embodiment in terms of the other points. In view of the above, the need for placing solders on the piezoelectric element 43 is eliminated. This elimination can restrain the piezoelectric element 43 from being cracked due to concentration of stresses arising from vibrations on parts of the piezoelectric element 43 provided with solders.

Figure 12:
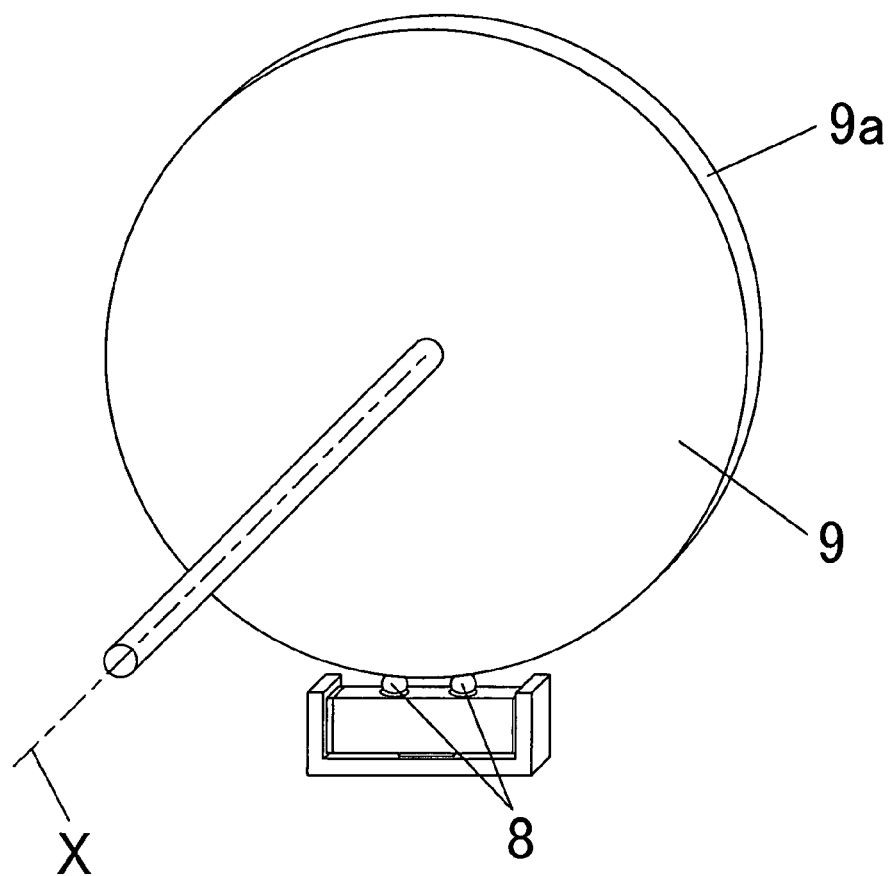
FIG. 12 is a perspective view of a modification of an ultrasonic actuator.
Figure 13:
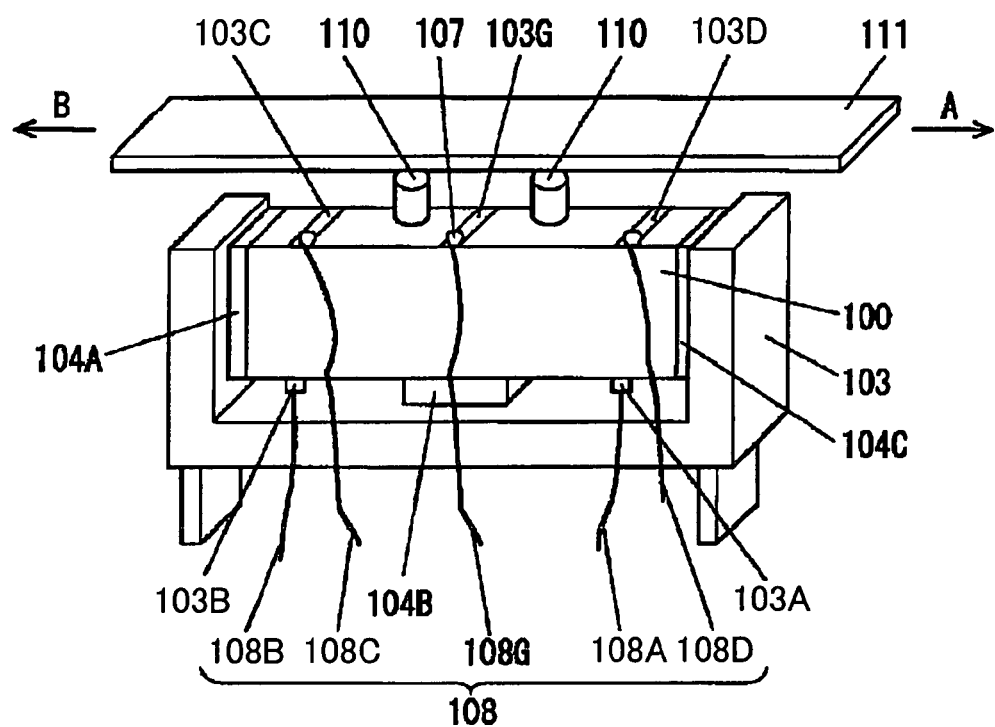
FIG. 13 is a perspective view of an ultrasonic actuator.
Figure 14A:
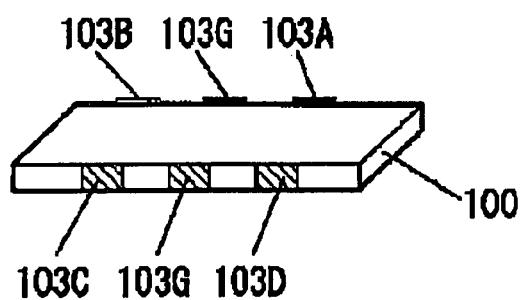
FIG. 14(a) is a perspective view of a piezoelectric element.
Figure 14B:
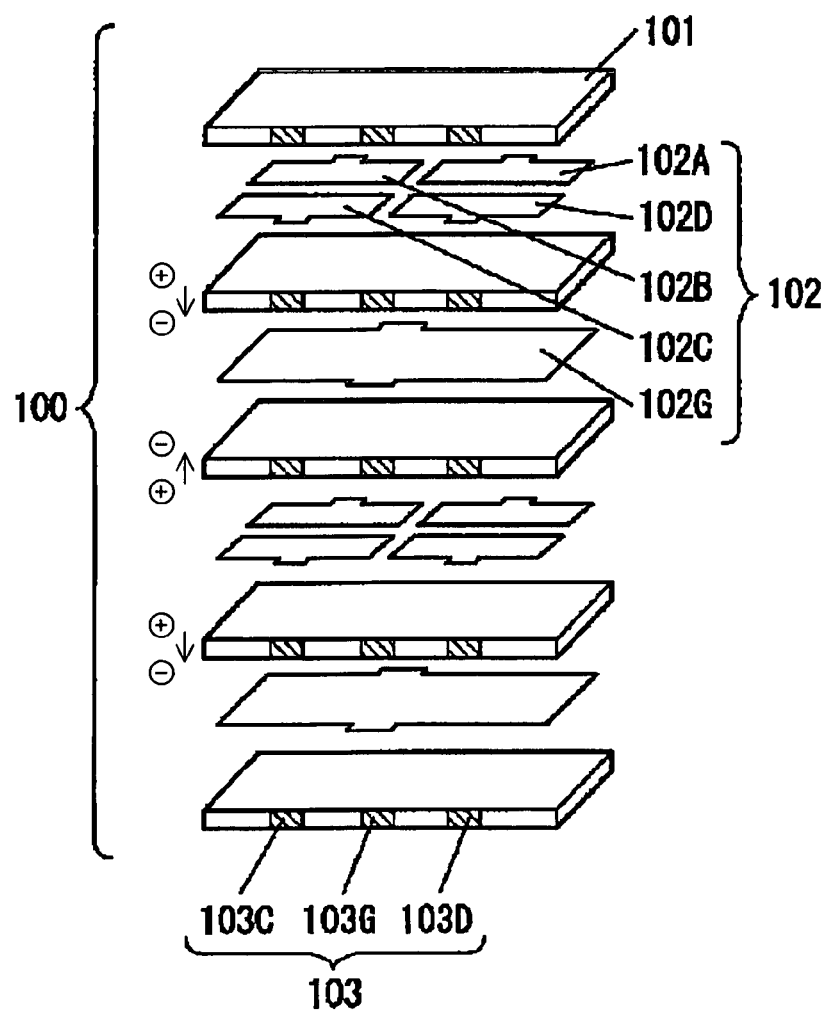
FIG. 14(b) is an exploded perspective view of the piezoelectric element.

In the above embodiment, a movable object 9 driven by applying the driving force of an ultrasonic actuator to the movable object 9 is flat-shaped. However, this is not restrictive. Any structure can be adopted as the structure of the movable object 9. For example, as illustrated in FIG. 12, the movable object may be a disk 9 rotatable about the predetermined axis X, and drivers 8, 8 of an ultrasonic actuator may abut against the edge surface 9a of the disk 9. When an ultrasonic actuator of this structure is driven, a generally elliptical motion of the drivers 8, 8 allows the disk 9 to rotate about the predetermined axis X.

In the above embodiment, the configuration in which drivers 8, 8 are placed on one end surface of a piezoelectric element 12 was described. However, drivers 8, 8 may be placed on one side surface of the piezoelectric element 12. In this case, while the directions in which the piezoelectric element is stretched in a primary mode of a stretching vibration correspond to the direction in which the drivers 8, 8 support a movable object 9, the vibration direction associated with a secondary mode of a bending vibration corresponds to the direction in which the movable object 9 can move.

In the above embodiments, a supporter is composed of a case 11. However, as long as an ultrasonic actuator has supporting members for supporting the piezoelectric element 12, the supporter may be composed of any element.

INDUSTRIAL APPLICABILITY

As described above, when, according to the present invention, the configuration of feed electrode layers is devised, this restrains vibration of a piezoelectric element from being inhibited. The present invention is useful for ultrasonic actuators for use in various electronic devices and other devices or the like.

The invention claimed is:

1. A piezoelectric element obtained by alternately stacking generally rectangular piezoelectric layers and internal electrode layers, wherein
the internal electrode layers include a common electrode layer and feed electrode layers alternately placed in a stacking direction with the piezoelectric layers interposed between the common electrode layer and the feed electrode layers,
the common electrode layer has a common electrode,
the feed electrode layers include a first feed electrode layer disposed on a principal surface of one of the piezoelectric layers and a second feed electrode layer disposed on a principal surface of one of the piezoelectric layers different from the piezoelectric layer on the principal surface of which the first feed electrode layer is disposed,
the first feed electrode layer has four divided electrodes respectively disposed on four areas defined by dividing the principal surface of the associated piezoelectric layer into two parts in the longitudinal and transverse directions, and a first connection electrode for providing connection between two of the four divided electrodes respectively disposed on two of the areas opposed along a first-diagonal-line direction of the principal surface of the associated piezoelectric layer,
the second feed electrode layer has four divided electrodes respectively disposed on the four areas, and a second connection electrode for providing connection between two of the four divided electrodes respectively disposed on two of the areas opposed along a second-diagonal-line direction of the principal surface of the associated piezoelectric layer,
the first and second connection electrodes are formed on parts of longitudinally middle parts of the associated piezoelectric layers except both transverse end parts of the associated piezoelectric layers, respectively,
the common electrode is connected to an external electrode disposed on an outer surface of the piezoelectric element,
the two divided electrodes of the first feed electrode layer respectively disposed on two of the areas opposed along the first-diagonal-line direction are connected through an external electrode disposed on the outer surface of the piezo electric element to the two divided electrodes of the second electrode layer respectively disposed on two of the areas opposed along the first-diagonal-line direction, and
the two divided electrodes of the first feed electrode layer respectively disposed on two of the areas opposed along the second-diagonal-line direction are connected through an external electrode disposed on the outer surface of the piezoelectric element to the two divided electrodes of the second electrode layer respectively disposed on two of the areas opposed along the second-diagonal-line direction.

2. The piezoelectric element of claim 1, wherein
the common electrode, the divided electrodes of the first feed electrode layer, and the divided electrodes of the second feed electrode layer are provided with lead electrodes, respectively, and
the lead electrodes are connected to the external electrodes.

3. The piezoelectric element of claim 2, wherein
the common electrode layer is prevented from coinciding with the lead electrode of the first feed electrode layer and the lead electrode of the second feed electrode layer when viewed in a stacking direction.

4. The piezoelectric element of claim 1, wherein
the divided electrodes are formed on parts of the associated piezoelectric layers except both longitudinal end parts of the associated piezo electric layers.

5. The piezoelectric element of claim 1, wherein
the divided electrodes are formed on parts of the associated piezoelectric layers except transversely middle parts of the associated piezoelectric layers.

6. The piezoelectric element of claim 1, wherein
the shape of a part of each said feed electrode layer formed of the associated divided electrodes and the associated connection electrode is point-symmetric with respect to the central point on the principal surface of the associated piezoelectric layer.

7. The piezo electric element of claim 1, wherein the shape of a part of the first feed electrode layer formed of the associated divided electrodes and the first connection electrode and the shape of a part of the second feed electrode layer formed of the associated divided electrodes and the second connection electrode are identical with each other but inverse to each other with respect to the central line extending along a longitudinal direction of the principal surface of the associated piezoelectric layer.

8. The piezoelectric element of claim 1, wherein the number of first feed electrode layers is equal to that of second feed electrode layers.

9. The piezoelectric element of claim 1, wherein the feed electrode layers are configured such that the first feed electrode layer and the second feed electrode layer are alternately placed in a stacking direction.

10. The piezo electric element of claim 1, wherein the outermost layers of the piezoelectric element are the piezoelectric layers.

11. The piezo electric element of claim 1, wherein the external electrodes are disposed only on the surrounding surfaces of the piezoelectric element including the end and side surfaces of the piezoelectric element.

12. An ultrasonic actuator comprising:
the piezoelectric element of claim 1;
a driver disposed on an end or side surface of the piezoelectric element; and
a movable object supported by the driver,
wherein the power supply to the internal electrode layers allows the piezoelectric element to create a vibration produced by synthesizing a primary mode of a stretching vibration and a secondary mode of a bending vibration, and the vibration allows the driver to produce a generally elliptical motion, thereby moving the movable object relative to the piezoelectric element.

13. The ultrasonic actuator of claim 12 further comprising a supporter having a supporting member for supporting a piezoelectric element,
the supporting member being made of conductive rubber.

14. A piezoelectric element obtained by alternately stacking generally rectangular piezoelectric layers and internal electrode layers, wherein:
the internal electrode layers include a common electrode layer and feed electrode layers alternately placed in a stacking direction with the piezoelectric layers interposed between the common electrode layer and the feed electrode layers,
the common electrode layer has a common electrode,
the feed electrode layers include a first feed electrode layer disposed on a principal surface of one of the piezoelectric layers and a second feed electrode layer disposed on a principal surface of one of the piezoelectric layers different from the piezoelectric layer on the principal surface of which the first feed electrode layer is disposed,
the first feed electrode layer has four divided electrodes respectively disposed on four areas defined by dividing the principal surface of the associated piezoelectric layer into two parts in the longitudinal and transverse directions, and a first connection electrode for providing connection between two of the four divided electrodes respectively disposed on two of the areas opposed along a first-diagonal-line direction of the principal surface of the associated piezoelectric layer,
the second feed electrode layer has four divided electrodes respectively disposed on the four areas, and a second connection electrode for providing connection between two of the four divided electrodes respectively disposed on two of the areas opposed along a second-diagonal-line direction of the principal surface of the associated piezoelectric layer,
the first and second connection electrodes are formed on longitudinally middle parts of the principal surfaces of the associated piezoelectric layers and shaped to extend substantially parallel to short sides of the principle surfaces of the piezoelectric layers, respectively,
the common electrode is connected to an external electrode disposed on an outer surface of the piezoelectric element,
the two divided electrodes of the first feed electrode layer respectively disposed on two of the areas opposed along the first-diagonal-line direction are connected through an external electrode disposed on the outer surface of the piezoelectric element to the two divided electrodes of the second electrode layer respectively disposed on two of the areas opposed along the first-diagonal-line direction, and
the two divided electrodes of the first feed electrode layer respectively disposed on two of the areas opposed along the second-diagonal-line direction are connected through an external electrode disposed on the outer surface of the piezoelectric element to the two divided electrodes of the second electrode layer respectively disposed on two of the areas opposed along the second-diagonal-line direction.

* * * * *